US011581200B2

(12) United States Patent
Haga et al.

(10) Patent No.: US 11,581,200 B2
(45) Date of Patent: Feb. 14, 2023

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kensuke Haga, Toyama (JP); Atsushi Moriya, Toyama (JP); Naoharu Nakaiso, Toyama (JP); Takahiro Miyakura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 217 days.

(21) Appl. No.: 16/790,294

(22) Filed: Feb. 13, 2020

(65) Prior Publication Data

US 2020/0185237 A1 Jun. 11, 2020

Related U.S. Application Data

(63) Continuation of application No. PCT/JP2018/020187, filed on May 25, 2018.

(30) Foreign Application Priority Data

Aug. 14, 2017 (JP) .............................. JP2017-156541

(51) Int. Cl.
*H01L 21/67* (2006.01)
*H01L 21/02* (2006.01)
*H01L 21/3065* (2006.01)
(52) U.S. Cl.
CPC ........... *H01L 21/67069* (2013.01); *H01L 21/02532* (2013.01); *H01L 21/3065* (2013.01)

(58) Field of Classification Search
None
See application file for complete search history.

(56) References Cited

U.S. PATENT DOCUMENTS

2002/0052120 A1 5/2002 Shintani et al.
2003/0139012 A1 7/2003 Yamauchi et al.
(Continued)

FOREIGN PATENT DOCUMENTS

JP 63-304631 A 12/1988
JP 2002-353205 A 12/2002
(Continued)

OTHER PUBLICATIONS

International Search Report for PCT/JP2018/020187, dated Aug. 21, 2018.
(Continued)

*Primary Examiner* — Roberts P Culbert
(74) *Attorney, Agent, or Firm* — Volpe Koenig

(57) ABSTRACT

There is provided a technique that includes: etching a portion of a first film formed on a surface of a substrate by performing a cycle a predetermined number of times, the cycle including: supplying an etching gas into a process chamber while raising an internal pressure of the process chamber in a state in which the substrate having the first film formed on the surface of the substrate is accommodated in the process chamber; and lowering the internal pressure of the process chamber by exhausting an interior of the process chamber in a state in which supply of the etching gas into the process chamber is stopped.

17 Claims, 8 Drawing Sheets

(56) References Cited

U.S. PATENT DOCUMENTS

| | | |
|---|---|---|
| 2005/0106892 A1 | 5/2005 | Oosaka |
| 2011/0287629 A1 | 11/2011 | Kakimoto et al. |
| 2014/0087568 A1 | 3/2014 | Noda et al. |
| 2018/0350668 A1* | 12/2018 | Cheng .................. C23C 16/045 |

FOREIGN PATENT DOCUMENTS

| | | |
|---|---|---|
| JP | 2003-218036 A | 7/2003 |
| JP | 2003-218037 A | 7/2003 |
| JP | 2005-150332 A | 6/2005 |
| JP | 2012-004542 A | 1/2012 |
| JP | 2012-146741 A | 8/2012 |
| JP | 2014-063860 A | 4/2014 |
| KR | 2002-0018022 A | 3/2002 |
| KR | 10-2011-0128145 A | 11/2011 |

OTHER PUBLICATIONS

Korean Office Action dated Aug. 17, 2021 for Korean Patent Application No. 10-2020-7004301.
Japanese Office Action dated Oct. 13, 2020 for Japanese Patent Application No. 2019-536426.

\* cited by examiner

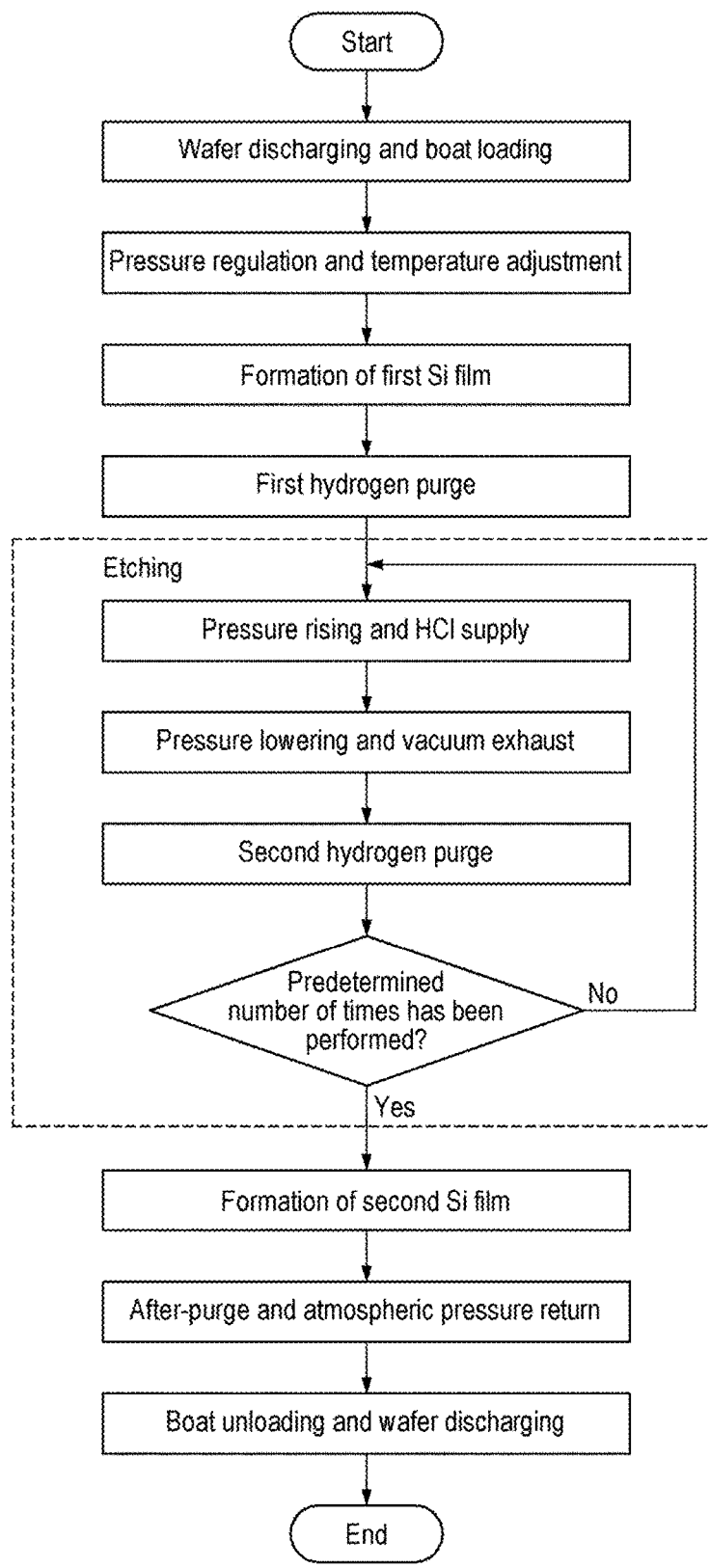

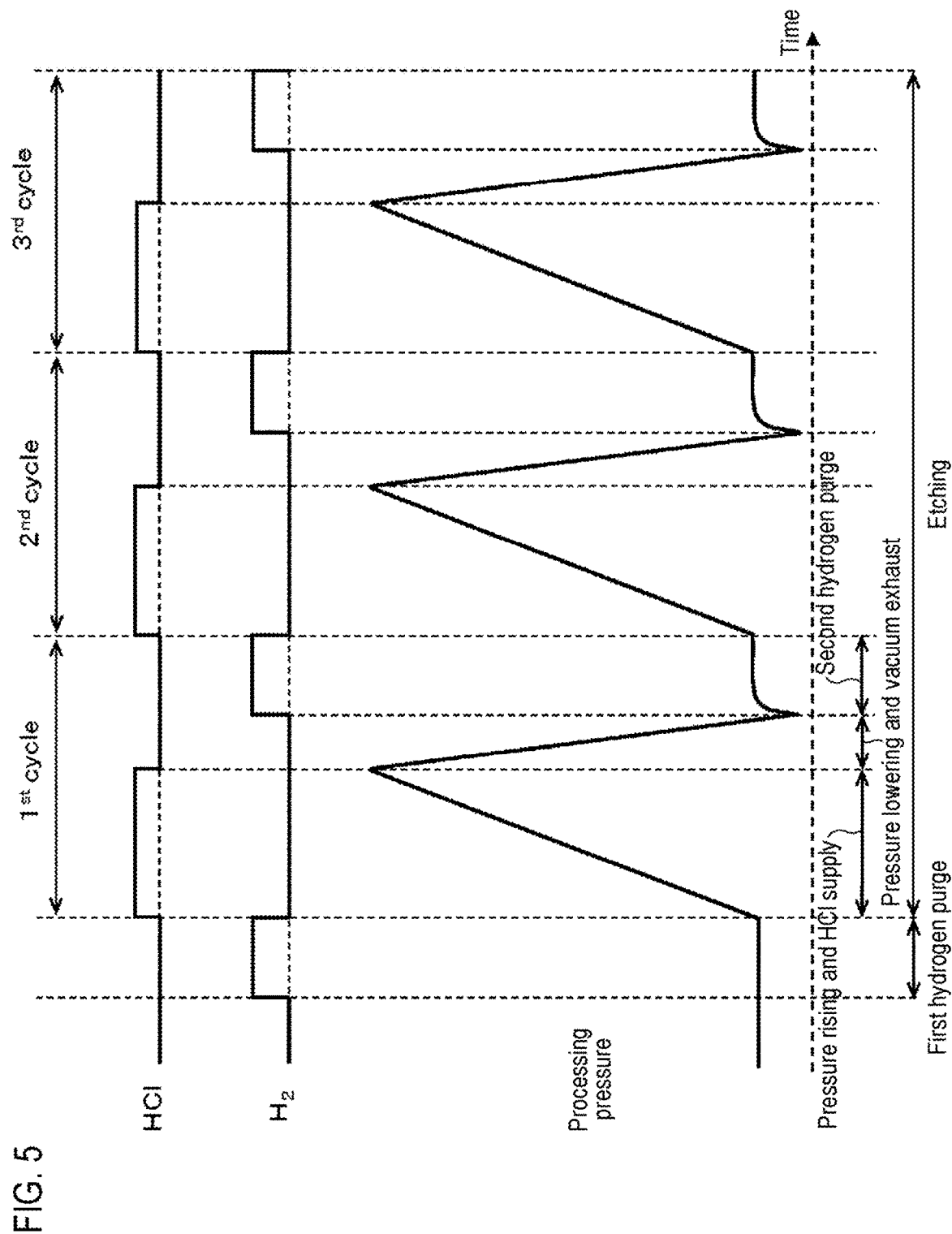

FIG. 7B
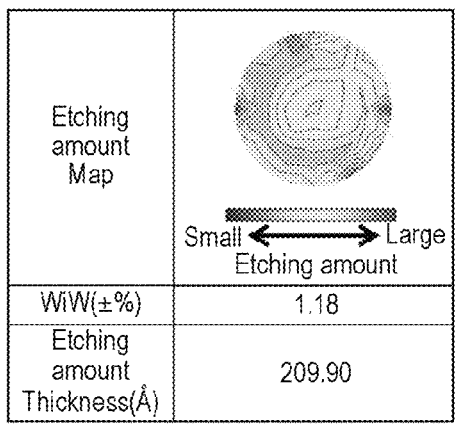
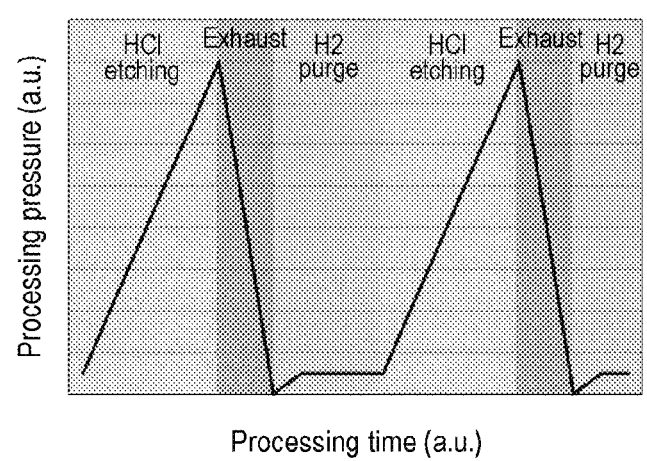
FIG. 7C
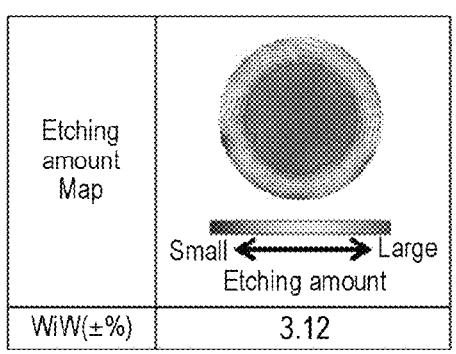
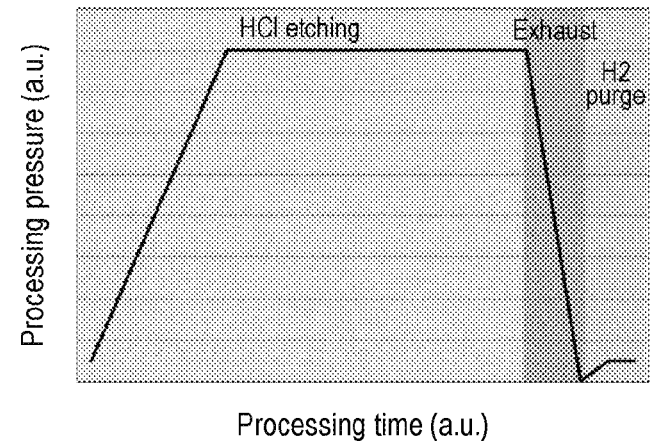

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2018/020187, filed on May 25, 2018 and designating the United States, the international application being based upon and claiming the benefit of priority from Japanese Patent Application No. 2017-156541, filed on Aug. 14, 2017, the entire content of which is incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a process of etching a portion of a film formed on a surface of a substrate using an etching gas is often performed.

SUMMARY

The present disclosure provides some embodiments of a technique capable of improving uniformity of an etching process in a plane of a substrate when a film formed on a surface of the substrate is etched.

According to one or more embodiments of the present disclosure, there is provided a technique that includes: etching a portion of a first film formed on a surface of a substrate by performing a cycle a predetermined number of times, the cycle including: supplying an etching gas into a process chamber while raising an internal pressure of the process chamber in a state in which the substrate having the first film formed on the surface of the substrate is accommodated in the process chamber; and lowering the internal pressure of the process chamber by exhausting an interior of the process chamber in a state in which supply of the etching gas into the process chamber is stopped.

BRIEF DESCRIPTION OF DRAWINGS

The accompanying drawings, which are incorporated in and constitute a part of the specification, illustrate embodiments of the present disclosure.

FIG. 4 is a flowchart illustrating a substrate-processing sequence according to embodiments of the present disclosure.

FIG. 5 is a diagram illustrating a gas supply sequence or the like extracted at a first hydrogen purge step and an etching step in FIG. 4.

FIG. 7B is a diagram illustrating an evaluation result (example 2) of uniformity of an etching amount of the Si film in the plane of the wafer, and FIG. 7C is a diagram illustrating an evaluation result (comparative example) of uniformity of an etching amount of the Si film in the plane of the wafer.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<One or More Embodiments of the Present Disclosure>

Embodiments of the present disclosure will now be described with reference to FIGS. 1 to 5 and 6A to 6D.

(1) Configuration of the Substrate Processing Apparatus

Figure 1:
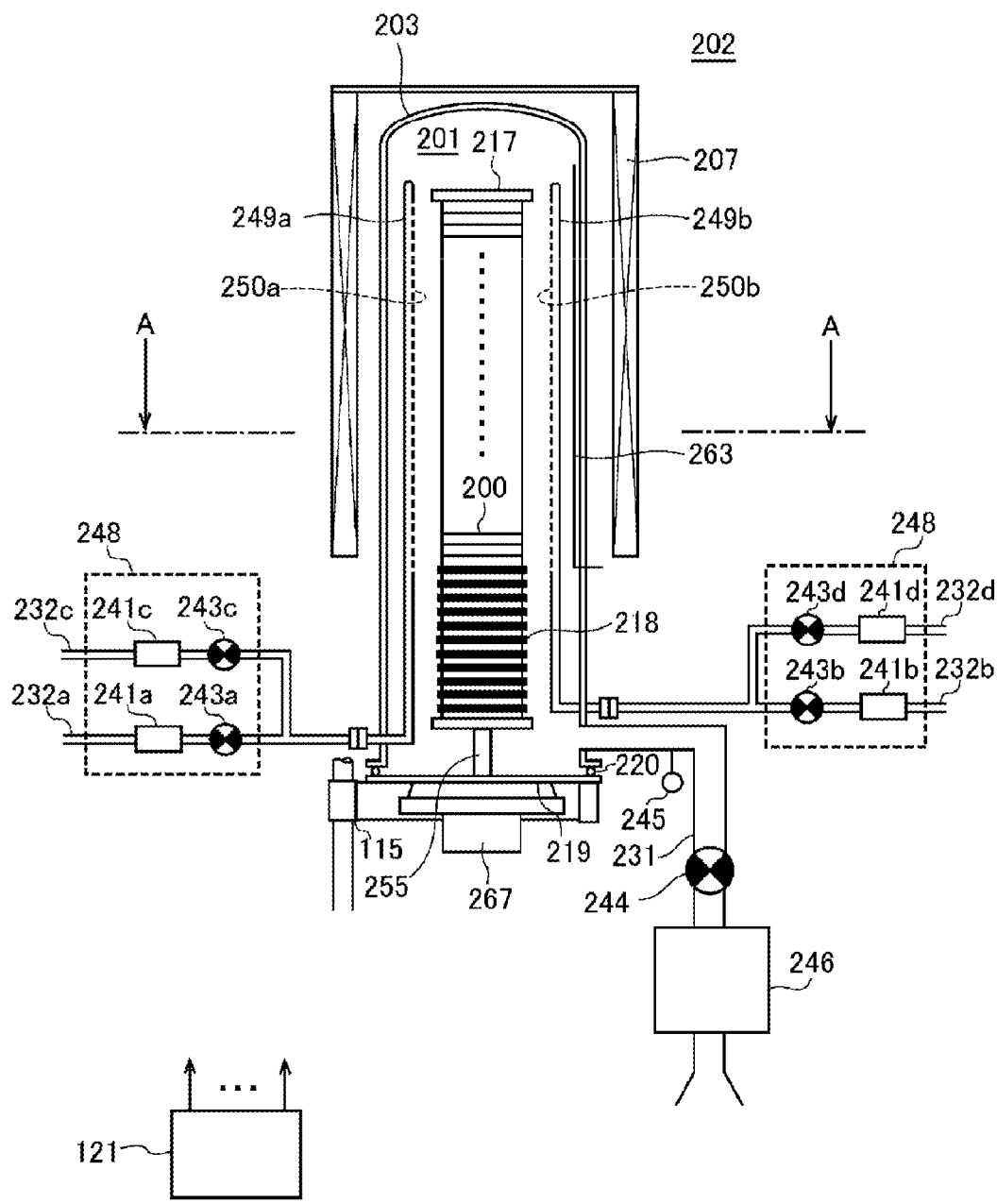
FIG. 1 is a schematic configuration diagram of a vertical type process furnace of a substrate processing apparatus suitably used in embodiments of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC), or the like, and has a cylindrical shape with its upper end closed and its lower end opened. A process chamber 201 is formed at a hollow cylindrical portion of the reaction tube 203. The process chamber 201 is configured to accommodate wafers 200 as substrates.

Nozzles 249a and 249b are installed in the process chamber 201 so as to penetrate a lower sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed at the gas supply pipes 232a and 232b sequentially from the corresponding upstream sides of gas flow, respectively. Gas supply pipes 232c and 232d are connected to the gas supply pipes 232a and 232b at the downstream side of the valves 243a and 243b, respectively. MFCs 241c and 241d, and valves 243c and 243d are installed at the gas supply pipes 232c and 232d sequentially from the corresponding upstream sides of gas flow, respectively.

Figure 2:
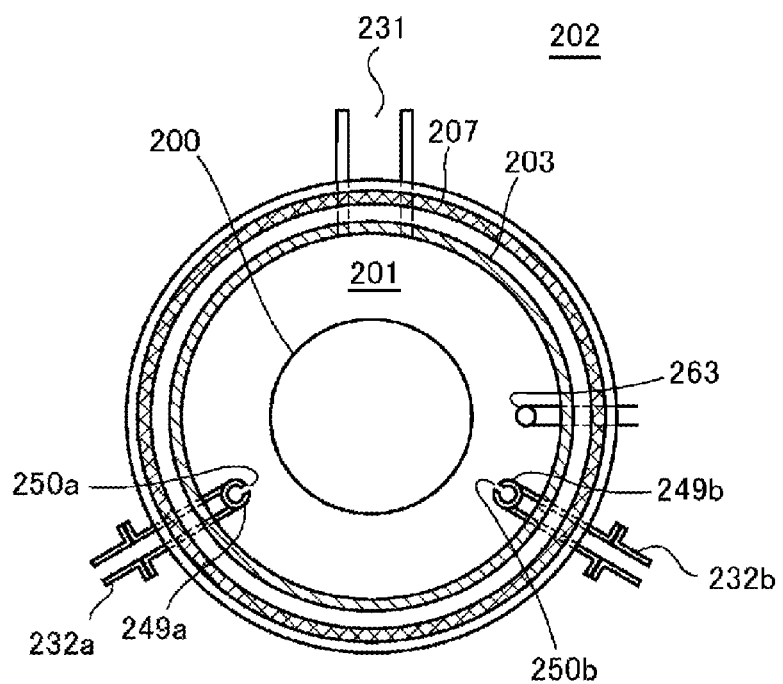
FIG. 2 is a schematic configuration diagram of the vertical type process furnace of the substrate processing apparatus suitably used in embodiments of the present disclosure, in which a portion of the process furnace is shown in a cross sectional view taken along line A-A in FIG. 1.

As illustrated in FIG. 2, each of the nozzles 249a and 249b is installed at a space with an annular plan-view shape between the inner wall of the reaction tube 203 and the wafers 200 so as to extend upward along a stacking direction of the wafers 200 from a lower portion of the inner wall of the reaction tube 203 to an upper portion of the inner wall of the reaction tube 203. That is, the nozzles 249a and 249b are installed at a lateral side of a wafer arrangement region in which the wafers 200 are arranged, namely at a region which horizontally surrounds the wafer arrangement region, so as to extend along the wafer arrangement region. Gas supply holes 250a and 250b for supplying a gas are formed at the side surfaces of the nozzles 249a and 249b, respectively. Each of the gas supply holes 250a and 250b is opened toward the center of the reaction tube 203 so as to allow a gas to be supplied toward the wafers 200. The gas supply holes 250a and 250b may be formed in a plural number between the lower portion and the upper portion of the reaction tube 203.

A precursor gas, for example, a silicon (Si)-containing gas, is supplied from the gas supply pipe 232a into the process chamber 201 via the MFC 241a, the valve 243a, and the nozzle 249a. As the Si-containing gas, it is possible to use, for example, a silicon hydride gas such as a monosilane ($SiH_4$, abbreviation: MS) gas or the like.

An etching gas is supplied from the gas supply pipe 232a into the process chamber 201 via the MFC 241a, the valve 243a, and the nozzle 249a. As the etching gas, it is possible to use, for example, a hydrogen chloride (HCl) gas which is a gas containing a halogen atom and an atom other than the halogen atom.

A dopant gas is supplied from the gas supply pipe 232b into the process chamber 201 via the MFC 241b, the valve 243b, and the nozzle 249b. As the dopant gas, it is possible to use, for example, a phosphine ($PH_3$, abbreviation: PH) gas containing phosphorus (P) as a dopant (impurity).

Each of a hydrogen ($H_2$) gas as a hydrogen (H)-containing gas and a nitrogen ($N_2$) gas as an inert gas is supplied from the gas supply pipes 232c and 232d into the process chamber 201 via the MFCs 241c and 241d, the valves 243c and 243d, the gas supply pipes 232a and 232b, and the nozzles 249a and 249b.

Each of a precursor gas supply system and an etching gas supply system mainly includes the gas supply pipe 232a, the MFC 241a, and the valve 243a. A dopant gas supply system mainly includes the gas supply pipe 232b, the MFC 241b, and the valve 243b. Each of a H-containing gas supply system and an inert gas supply system mainly includes the gas supply pipes 232c and 232d, the MFCs 241c and 241d, and the valves 243c and 243d.

One or all of various supply systems described above may be configured as an integrated supply system 248 in which the valves 243a to 243d, the MFCs 241a to 241d, and the like are integrated. The integrated supply system 248 is connected to each of the gas supply pipes 232a to 232d so that a supply operation of various kinds of gases into the gas supply pipes 232a to 232d, i.e., an opening/closing operation of the valves 243a to 243d, a flow-rate-adjusting operation by the MFCs 241a to 241d or the like, is controlled by a controller 121 which will be described below. The integrated supply system 248 is configured as an integral type or division type integrated unit, and is also configured so that it is detachable from the gas supply pipes 232a to 232d or the like, so as to perform maintenance, replacement, expansion, or the like of the integrated supply system 248, on an integrated unit basis.

An exhaust pipe 231 configured to exhaust the internal atmosphere of the process chamber 201 is connected to a lower sidewall of the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an APC (auto pressure controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the pressure sensor 245, and the APC valve 244. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is made of a metal material such as, e.g., stainless steel (SUS) or the like, and is formed in a disc shape. An O-ring 220, which is a seal member making contact with the lower end portion of the reaction tube 203, is installed at an upper surface of the seal cap 219. A rotation mechanism 267 configured to rotate a boat 217, which will be described below, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Under the boat 217, heat insulating plates 218 made of a heat resistant material such as quartz or SiC are supported in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
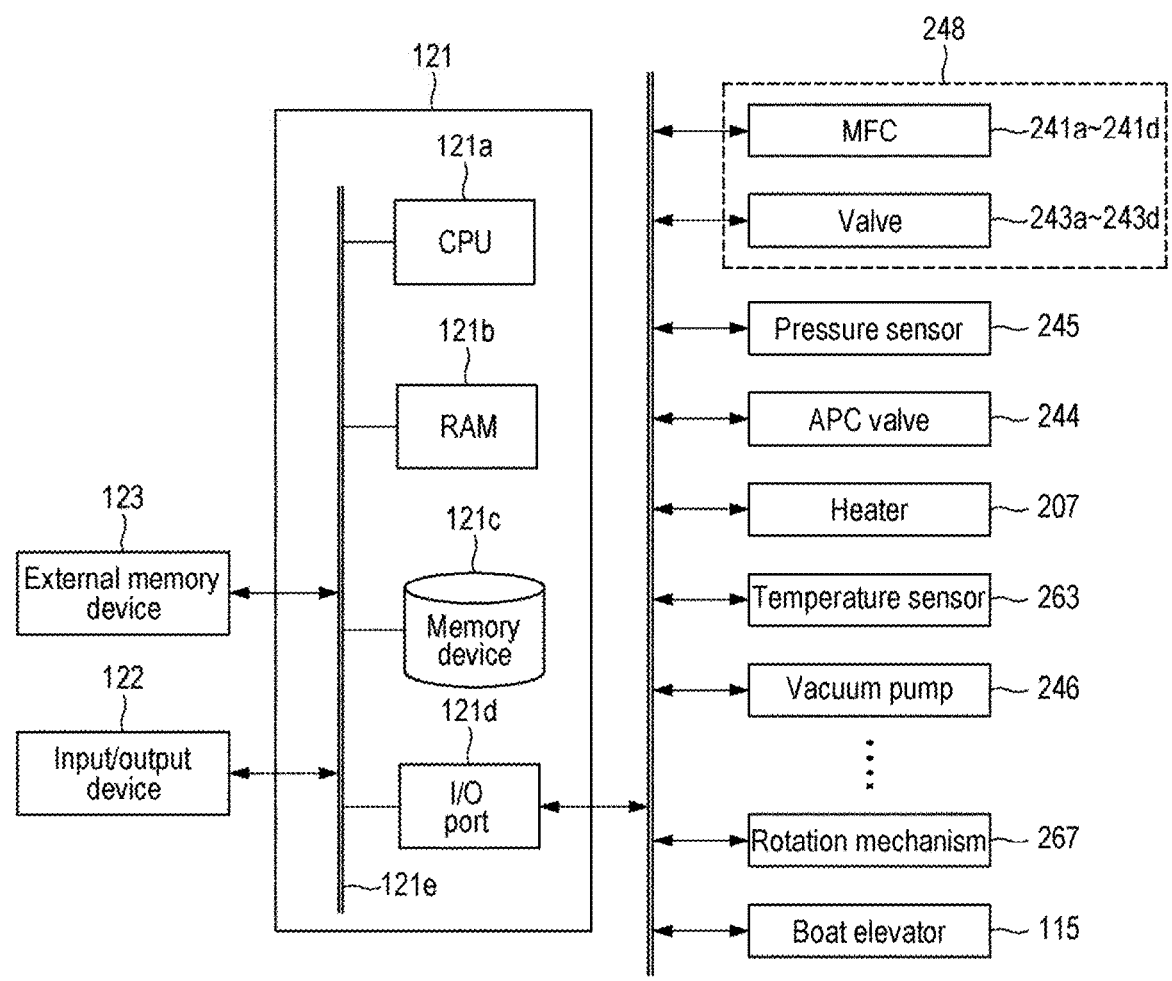
FIG. 3 is a schematic configuration diagram of a controller of the substrate processing apparatus suitably used in embodiments of the present disclosure, in which a control system of the controller is shown in a block diagram.

As illustrated in FIG. 3, the controller 121, which is a control part (control means), may be configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a HDD (Hard Disk Drive), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate-processing process, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data, or the like read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like, as described above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow-rate-adjusting operation of various kinds of gases by the MFCs 241a to 241d, the opening/closing operation of the valves 243a to 243d, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 and adjusting the rotation speed of the boat 217 with the rotation mechanism 267, the operation of moving the boat 217 up and down with the boat elevator 115, and the like.

The controller 121 may be configured by installing, on the computer, the aforementioned program stored in an external memory device 123 (for example, a magnetic disc such as a HDD, an optical disc such as a CD, a magneto-optical disc such as a MO, or a semiconductor memory such as a USB memory). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate-Processing Process

A sequence example of forming a silicon film (Si film) on a wafer 200 as a substrate using the aforementioned substrate processing apparatus, which is a process for manufacturing a semiconductor device, will be described mainly with reference to FIGS. 4, 5, and 6A to 6D. In the following descriptions, the operations of the respective parts constituting the substrate processing apparatus are controlled by the controller 121.

In the substrate-processing sequence of the present embodiments, there are performed: a step of forming a first film (first Si film) so as to embed an inside of a recess formed at a surface of a wafer 200; a step of etching a portion of the first Si film formed on the surface of the wafer 200; and a step of forming a second film (second Si film) on the partially etched first Si film, to thereby embed the inside of the recess with the first Si film and the second Si film.

Furthermore, at the step of etching a portion of the first Si film, a cycle is performed a predetermined number of times, the cycle including a step of supplying a HCl gas as an etching gas into the process chamber 201 while raising an internal pressure of the process chamber 201 in a state in which the wafer 200 having the first Si film formed on its surface is accommodated in the process chamber 201; and a step of lowering the internal pressure of the process chamber 201 by exhausting an interior of the process chamber 201 in a state in which the supply of the HCl gas into the process chamber 201 is stopped.

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 via the O-ring 220.

Figure 6A:
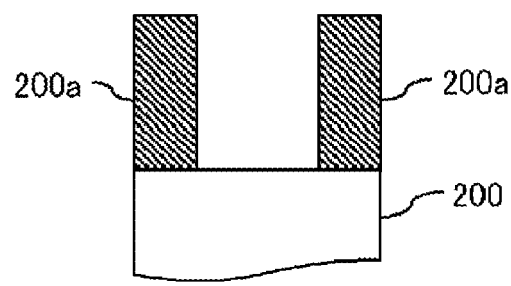
FIG. 6A is an enlarged cross sectional view illustrating a surface structure of a wafer before forming a first Si film.

For example, a Si substrate made of single crystal Si or a substrate on which a single crystal Si film is formed on its surface may be used as the wafers 200. As illustrated in FIG. 6A, a recess is formed at a surface of a wafer 200. The bottom portion of the recess is made of single crystal Si, and the side portion and the upper portion of the recess are formed by an insulating film 200a such as a silicon oxide film (SiO film), a silicon nitride film (SiN film), a silicon oxycarbonitride film (SiOCN film), or the like. The surface of the wafer 200 is in a state in which the single crystal Si and the insulating film 200a are each exposed.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The operation of the vacuum pump 246 and the heating and rotation of the wafers 200 may be all continuously performed at least until the process to the wafers 200 is completed.

(First-Si-Film-Forming Step)

Thereafter, a MS gas is supplied to the wafer 200 accommodated within the process chamber 201. At this step, the valve 243a is opened to allow a MS gas to flow into the gas supply pipe 232a. The flow rate of the MS gas is adjusted by the MFC 241a. The MS gas is supplied into the process chamber 201 via the nozzle 249a and is exhausted from the exhaust pipe 231. At this time, the MS gas is supplied to the wafer 200. Simultaneously, the valves 243c and 243d may be opened to allow $N_2$ gas to flow into the gas supply pipes 232c and 232d. The flow rate of the $N_2$ gas is adjusted by the MFCs 241c and 241d. The $N_2$ gas is supplied into the process chamber 201 via the nozzles 249a and 249b.

Figure 6B:
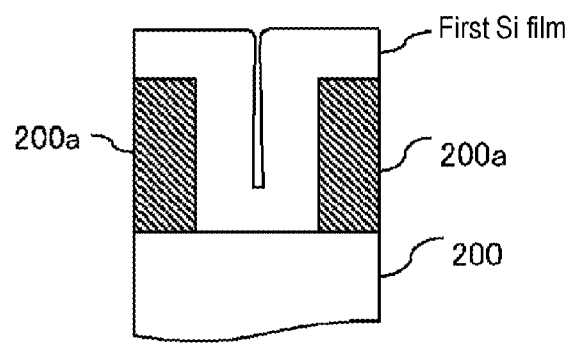
FIG. 6B is an enlarged cross sectional view illustrating a surface structure of a wafer after forming the first Si film.

By supplying the MS gas to the wafer 200, as illustrated in FIG. 6B, a first Si film can be formed so as to embed the inside of the recess. In this film-forming process, the surface side of the recess is closed by the first Si film grown so as to overhang from the side portion and the upper portion of the recess. In addition, a non-embedded region extending in a depth region (direction), i.e., a hollow portion such as a void, a seam, or the like, may be formed in the recess. The hollow portion is generated when the surface side of the recess is closed before the inside of the recess is completely embedded with the first Si film, the MS gas does not reach the inside of the recess, and the growth of the first Si film in the recess is stopped. The hollow portion is likely to be generated when the aspect ratio of the recess (the depth of the recess/the width of the recess) is increased, specifically, when the aspect ratio is 1 or more, e.g., 20 or more, and further 50 or more. Furthermore, the larger the aspect ratio, the hollow portion is easier formed on the bottom side in the recess. In addition, Si is subject to amorphous growth, polycrystalline growth, or mixed crystal growth of amorphous and polycrystal at least in the side portion and the upper portion of the recess under conditions as described hereinbelow. That is, the crystal structure of the first Si film grown so as to overhang at least from the side portion and the upper portion of the recess becomes amorphous, polycrystal, or a mixed crystal of amorphous and polycrystal.

After the first Si film is formed, the valve 243a is closed to stop the supply of the MS gas into the process chamber 201. The supply of the MS gas may be stopped before the surface side of the recess is closed by the first Si film, or may also be stopped after the surface side thereof is completely closed. Thereafter, the interior of the process chamber 201 is vacuum-exhausted and the gas or the like, which remains within the process chamber 201, is removed from the interior of the process chamber 201. At this time, the valves 243c and 243d are opened to allow a $N_2$ gas to be supplied into the process chamber 201. The $N_2$ gas acts as a purge gas.

An example of the processing conditions at this step may be described as follows:

Supply flow rate of MS gas: 10 to 2,000 sccm
Supply flow rate of $N_2$ gas (for each gas supply pipe): 0 to 10,000 sccm
Supply time of gas: 20 to 400 minutes
Processing temperature: 450 to 550 degrees C., or 450 to 530 degrees C. in some embodiments
Processing pressure: 1 to 900 Pa.

Furthermore, by setting the processing temperature at 530 degrees C. or lower or lower than 530 degrees C. in some embodiments, it is possible to easily make the crystal structure of the first Si film amorphous, to further increase the etching rate at an etching step as described hereinbelow, and to further improve the productivity. In addition, since the crystallization temperature of Si is about 530 degrees C., it is possible to make the crystal structure of the first Si film amorphous by setting the processing temperature at lower than 530 degrees C., to make the crystal structure of the first Si film polycrystal by setting the processing temperature at higher than 530 degrees C., and to make the crystal structure of the first Si film be a mixed crystal of amorphous and polycrystal by setting the processing temperature at around 530 degrees C.

As the precursor gas, it is possible to use, in addition to the MS gas, a silicon hydride gas expressed by a general formula $Si_nH_{2n+2}$ (where n is an integer of 1 or more) such as a disilane ($Si_2H_6$, abbreviation: DS) gas, a trisilane ($Si_3H_8$) gas, a tetrasilane ($Si_4H_{10}$) gas, or the like. Furthermore, as the precursor gas, it is possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas, or the like.

As the inert gas, it is possible to use, in addition to the $N_2$ gas, a rare gas such as an Ar gas, a He gas, a Ne gas, a Xe gas, or the like. This also applies to each step as described hereinbelow.

(First Hydrogen Purge Step)

After the first-Si-film-forming step is completed, a $H_2$ gas is supplied to the wafer 200 in the process chamber 201, i.e., to the first Si film formed on the wafer 200. Specifically, the valves 243c and 243d are opened to allow a $H_2$ gas to flow into the gas supply pipes 232c and 232d. The flow rate of the $H_2$ gas is adjusted by the MFCs 241c and 241d. The $H_2$ gas is supplied into the process chamber 201 via the gas supply pipes 232a and 232b and the nozzles 249a and 249b and is exhausted from the exhaust pipe 231. At this time, the $H_2$ gas is supplied to the wafer 200. By supplying the $H_2$ gas to the wafer 200, the surface of the first Si film formed on the wafer 200 is terminated with hydrogen, and the entire surface can be cleaned.

Thereafter, the valves 243c and 243d are closed and the supply of the $H_2$ gas into the process chamber 201 is stopped. At this time, the interior of the process chamber 201 is exhausted by the vacuum pump 246 with the APC valve 244 kept open. At this time, the $N_2$ gas may be supplied into the process chamber 201. The $N_2$ gas acts as a purge gas.

An example of the processing conditions at this step may be described as follows:

Supply flow rate of $H_2$ gas: 500 to 3,000 sccm
Supply time of gas: 20 to 400 minutes
Processing pressure: 1 to 1,000 Pa.

Other processing conditions such as the processing temperature or the like may be similar to the processing conditions of the first-Si-film-forming step.

(Etching Step)

After the first hydrogen purge step is completed, a pressure-rising and HCl supply step, a pressure-lowering and vacuum exhaust step, and a second hydrogen purge step, as described hereinbelow, are sequentially performed.

[Pressure-Rising and HCl Supply Step]

At this step, a HCl gas is supplied to the wafer 200 in the process chamber 201, i.e., to the first Si film formed on the wafer 200 and subjected to the first hydrogen purge step. Specifically, the opening/closing control of the valves 243a, 243c, and 243d is performed in the same procedure as the opening/closing control of the valves 243a, 243c, and 243d at the first-Si-film-forming step. The flow rate of the HCl gas is adjusted by the MFC 241a. The HCl gas is supplied into the process chamber 201 via the nozzle 249a and is exhausted from the exhaust pipe 231. At this time, the HCl gas is supplied to the wafer 200.

Figure 6C:
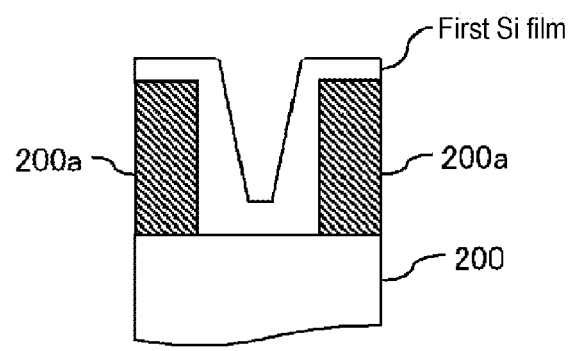
FIG. 6C is an enlarged cross sectional view illustrating a surface structure of a wafer after etching a portion of the first Si film.

By supplying the HCl gas to the wafer 200, a portion of the first Si film formed on the wafer 200 can be etched. By removing a portion of the first Si film which closes the surface side of the recess, the upper portion of the hollow portion formed thereunder can be opened to expose the inner wall (the sidewall or the bottom portion) of the hollow portion. By continuously performing the etching process for a predetermined time in this state, it is possible to further etch the first Si film constituting the inner wall of the hollow portion and to expand the opening. The supply amount of the HCl gas into the hollow portion is gradually reduced from the surface side toward the bottom side. Therefore, the vertical cross sectional shape of the exposed hollow portion approaches a V shape or an inverted trapezoidal shape in which the opening width gradually increases from the bottom side toward the surface side, as illustrated in FIG. 6C. By processing the exposed hollow portion into such a shape, it becomes possible to promote the supply of the MS gas into the exposed hollow portion at a second-Si-film-forming step as described hereinbelow. As a result, the inside of the recess can be embedded with the Si film completely, i.e., to become in a void-free and seamless state.

At the start of this step, the internal pressure of the process chamber 201 is set at a relatively low predetermined pressure (start pressure). By starting this step under such pressure conditions, it is possible to increase the flow velocity (diffusion speed) of the HCl gas supplied into the process chamber 201, and to supply the HCl gas in a uniform amount to the entire region in the process chamber 201, i.e., over the entire region in-plane of the wafer 200. As a result, the aforementioned etching process can start at a uniform timing over the entire region in-plane of the wafer 200 and can go ahead at a uniform rate.

When the HCl gas is supplied into the process chamber 201 after the start of this step, the opening degree of the APC valve 244 is adjusted such that the internal pressure of the process chamber 201 is continuously raised. At this step, the step of supplying the HCl gas into the process chamber 201 while maintaining the internal pressure of the process chamber 201 at a constant pressure, or the step of supplying the HCl gas into the process chamber 201 while lowering the internal pressure of the process chamber 201 is not performed. By controlling the internal pressure of the process chamber 201 in this way, it is possible to prevent the internal pressure of the process chamber 201 from being maintained at a constant high pressure, and to prevent, for example, the HCl gas from staying at the center of the wafer 200. Thus, it is possible to suppress the deterioration of the uniformity of the etching amount of the first film in the plane of the wafer 200. In addition, it is possible to gradually increase (vary) the etching rate of the first Si film and thus to improve the efficiency of the etching process.

Furthermore, if the internal pressure of the process chamber 201 excessively rises or is maintained at a constant high pressure, there may be a case where the flow velocity of the HCl gas in the process chamber 201 is reduced, and for example, the HCl gas stays at the center of the wafer 200. When the HCl gas stays at the center of the wafer 200, the etching amount of the first Si film at the center of the wafer 200 may be larger than the etching amount of the first Si film at the peripheral portion of the wafer 200, deteriorating the uniformity of the etching amount in the plane of the wafer 200. Therefore, when the internal pressure of the process chamber 201 reaches a relatively high predetermined pressure (end pressure), the valve 243a is closed to stop the supply of the HCl gas into the process chamber 201 and this step is completed. Then, the pressure-lowering and vacuum exhaust step as described hereinbelow immediately starts without maintaining a state in which the internal pressure of the process chamber 201 becomes equal to or higher than the end pressure.

An example of the processing conditions at this step may be described as follows:

Supply flow rate of HCl gas: 100 to 10,000 sccm
Supply time of gas: 10 to 60 minutes
Start pressure (processing pressure at start of this step): 1 to 1,000 Pa
End pressure (processing pressure at end of this step): 28,000 to 32,000 Pa
Average-pressure-rising rate: 400 to 1,100 Pa/min.

Other processing conditions such as the processing temperature or the like may be similar to the processing conditions of the first-Si-film-forming step.

The processing pressure (the pressure equal to or higher than the start pressure and equal to or lower than the end pressure) at this step is a pressure which can allow to prevent the HCl gas from staying at the center of the wafer 200 and maintain the in-plane uniformity of the etching amount of the first Si film at least as long as the processing pressure continuously rises. The end pressure at this step is a pressure which is equal to a maximum internal pressure of the process chamber at the etching step and is higher than a maximum internal pressure of the process chamber at the first-Si-film-forming step described above and the second-Si-film-forming step as described hereinbelow.

Furthermore, the processing temperature at this step includes a temperature at which the amorphous state of the first Si film is maintained when the first Si film formed on the wafer 200 at the first-Si-film-forming step is in an amorphous state, i.e., a temperature at which the crystallization of the first Si film is avoided. The temperature at which the crystallization of the first Si film is avoided is a temperature at which the first Si film is not polycrystallized, and is also a temperature at which the first Si film is not epitaxiallized (single-crystallized). This temperature is also a temperature at which the in-plane uniformity of the etching amount of the first Si film can be further improved because the crystallization of the first Si film is avoided. By setting the temperature of the wafer 200 to be equal to or lower than a temperature of about 530 degrees C. (450 to 530 degrees C.) which is a critical temperature (crystallization temperature of Si) between a temperature at which amorphous Si is formed and a temperature at which poly-Si starts to be formed, it becomes easy to maintain the amorphous state of the first Si film. Furthermore, by setting the temperature of the wafer 200 at a temperature lower than 530 degrees C., it is possible to reliably maintain the amorphous state of the first Si film. These also apply to steps after this step.

[Pressure-Lowering and Vacuum Exhaust Step]

When the pressure-rising and HCl supply step is completed, the valve 243a is closed, the supply of the HCl gas into the process chamber 201 is stopped, and in this state, the APC valve 244 is fully opened. Thus, the interior of the process chamber 201 is vacuum-exhausted (vacuumized) to lower the internal pressure of the process chamber 201.

A pressure change amount (a pressure change rate or a pressure-lowering rate) per unit time at this step may be set larger than a pressure change amount (a pressure change rate or a pressure-rising rate) per unit time at the pressure-rising and HCl supply step. Specifically, the average-pressure-lowering rate during the execution period of this step may be set at a rate which is larger than the average-pressure-rising rate at the pressure-rising and HCl supply step described above and which falls within a range of, for example, 5,000 to 7,000 Pa/min. The execution time of this step may be set at a time which is shorter than the execution time of the pressure-rising and HCl supply step and which falls within a range of, for example, 5 to 10 minutes. By performing this step for a predetermined time, the internal pressure of the process chamber 201 reaches a pressure (vacuum exhaust pressure) which falls within a range of, for example, 20 to 30 Pa.

[Second Hydrogen Purge Step]

When the internal pressure of the process chamber 201 reaches a predetermined vacuum exhaust pressure, a $H_2$ gas is supplied into the process chamber 201 according to the same processing procedures as those of the first hydrogen purge step. Thus, HCl; Cl, or the like remaining within the process chamber 201 can be efficiently removed from the interior of the process chamber 201. Thereafter, the process chamber 201 is exhausted by the same processing procedure as that of the first hydrogen purge step. The supply time of the $H_2$ gas may be set at a time which falls within a range of, for example, 5 to 10 minutes. Other processing conditions may be similar to the processing conditions of the first hydrogen purge step.

[Performing a Predetermined Number of Times]

A cycle which non-simultaneously, i.e., non-synchronously, performs three steps described above is performed a predetermined number of times (n times, where n is an integer of 1 or more). FIG. 5 illustrates an example in which this cycle is performed three times. By performing the cycle in this way multiple times, for example, about 3 to 10 times, it is possible to expose the hollow portion and to easily process the vertical cross sectional shape of the exposed hollow portion into a V-shape or the like even when the aspect ratio of the recess formed on the surface of the wafer 200 is, for example, 20 or more, i.e., even when the hollow portion is formed at the bottom side in the recess. As a result, it is possible to more reliably embed the inside of the recess with the Si film at the second-Si-film-forming step as described hereinbelow.

(Second-Si-Film-Forming Step)

After the etching step is completed, a MS gas is supplied to the first Si film formed on the wafer 200 in the process chamber 201, i.e., on the wafer 200, and then subjected to the etching process, i.e., to the partially etched first Si film, according to the same processing procedures as those of the first-Si-film-forming step. The supply time of the MS gas may be set at a time which falls within a range of, for example, 10 to 300 minutes. Other processing conditions may be set to the same processing conditions as those of the first-Si-film-forming step.

Figure 6D:
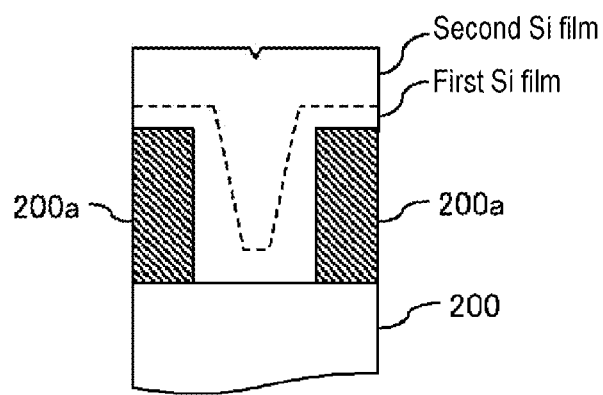
FIG. 6D is an enlarged cross sectional view illustrating a surface structure of a wafer after forming a second Si film on the partially etched first Si film.

By supplying the MS gas to the wafer 200, as illustrated in FIG. 6D, a second Si film can be formed on the wafer 200, i.e., on the surface of the partially etched first Si film. As described above, by performing the etching step, the hollow portion of the first Si film is in a state of being opened in its upper portion to be exposed, and is processed into a V shape or the like in which the opening width gradually increases from the bottom side to the surface side, in its vertical cross sectional shape. Thus, the second Si film does not grow so as to overhang from the side portion or the like of the opened hollow portion. That is, a case where the surface side of the opened hollow portion is not closed and the MS gas does not reach the inside of the hollow portion is eliminated. As a result, the hollow portion is not formed in the second Si film, and the inside of the recess formed at the surface of the wafer 200 is embedded with the first Si film and the second Si film completely, i.e., to become in a void-free and seamless state. Furthermore, the crystal structure of the second Si film becomes amorphous, polycrystal, or a mixed crystal thereof under the processing conditions of this step.

Thereafter, the valve 243a is closed to stop the supply of the MS gas into the process chamber 201. Then, the interior of the process chamber 201 is vacuum-exhausted and the gas or the like, which remains within the process chamber 201, is removed from the interior of the process chamber 201 according to the same processing procedures as those of the first-Si-film-forming step.

(After-Purge and Atmospheric Pressure Return)

After the second-Si-film-forming step is completed, the $N_2$ gas is supplied from each of the gas supply pipes 232c and 232d into the process chamber 201 and is exhausted from the exhaust pipe 231. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

Thereafter, the seal cap 219 is moved down by the boat elevator 115 to open the lower end of the reaction tube 203. Then, the processed wafers 200 supported on the boat 217 are unloaded from the lower end of the reaction tube 203 to the outside of the reaction tube 203 (boat unloading). The processed wafers 200 are unloaded to the outside of the reaction tube 203 and are subsequently discharged from the boat 217 (wafer discharging).

(3) Effects according to the Present Embodiments

According to the present embodiments, one or more effects as set forth below may be achieved.

(a) By performing a cycle including the pressure-rising and HCl supply step and the pressure-lowering and vacuum exhaust step a predetermined number of times at the etching step, the upper portion of the hollow portion of the first Si film can be opened and the vertical cross sectional shape thereof can be processed into a V-shape or the like. This makes it possible to more reliably embed the inside of the recess with the Si film at the second-Si-film-forming step.

(b) By setting the internal pressure of the process chamber 201 at a relatively low start pressure at the start of the pressure-rising and HCl supply step, it is possible to increase the flow velocity of the HCl gas supplied into the process chamber 201 and to make the supply amount of the HCl gas in the plane of the wafer 200 uniform. As a result, it is possible to allow the etching process of the first Si film to start at a uniform timing over the entire in-plane of the wafer 200, and to go ahead at a uniform rate. That is, it is possible to improve the uniformity of the etching process in the plane of the wafer 200.

(c) By continuously raising the internal pressure of the process chamber 201 when the HCl gas is supplied into the process chamber 201 after the start of the pressure-rising and HCl supply step, it is possible to prevent the internal pressure of the process chamber 201 from being maintained at a constant high pressure, and to avoid the HCl gas from staying at the center or the like of the wafer 200. This makes it possible to suppress the deterioration of the uniformity of the etching process of the first Si film in the plane of the wafer 200. Moreover, by continuously raising the internal pressure of the process chamber 201, it is possible to increase the etching rate of the first Si film and to improve the efficiency of the etching process.

(d) By immediately completing the pressure-rising and HCl supply step and immediately starting the pressure-lowering and vacuum exhaust step when the internal pressure of the process chamber 201 reaches a predetermined end pressure, it is possible to avoid the HCl gas from staying at the center or the like of the wafer 200. This makes it possible to suppress the deterioration of the uniformity of the etching process of the first Si film in the plane of the wafer 200.

(e) By performing the pressure-lowering and vacuum exhaust step in a state in which the supply of the HCl gas into the process chamber 201 is stopped, it is possible to reduce the amount of the HCl gas used at the etching step and to reduce the gas cost. In addition, since the execution time of the pressure-lowering and vacuum exhaust step is relatively short, even if the supply of the HCl gas into the process chamber 201 is performed at the pressure-lowering and vacuum exhaust step, the HCl gas supplied at this time tends to hardly contribute to the etching process. Therefore, even if the pressure-lowering and vacuum exhaust step is performed in a state in which the supply of the HCl gas into the process chamber 201 is stopped, the efficiency of the etching process is hardly lowered.

(f) By performing the pressure-lowering and vacuum exhaust step with the supply of the HCl gas into the process chamber 201 stopped, it is possible to efficiently and effectively exhaust the HCl gas from the interior of the process chamber 201 once. As a result, it is possible to prevent the lowering of the efficiency of the etching process of the first Si film when performing the pressure-rising and HCl supply step of a next cycle. This makes it possible to shorten the processing time per one cycle and to improve the productivity.

(g) By setting the pressure-rising rate at the pressure-rising and HCl supply step lower than the pressure-lowering rate at the pressure-lowering and vacuum exhaust step, it is possible to make the execution time of the pressure-rising and HCl supply step lengthened, for example, longer than the execution time of the pressure-lowering and vacuum exhaust step. That is, it is possible to ensure a long time during which the HCl gas supplied into the process chamber 201 can diffuse at a high flow velocity without staying on the surface of the wafer 200. This makes it possible to improve the uniformity of the etching process of the first Si film in the plane of the wafer 200.

(h) By making the pressure-lowering rate at the pressure-lowering and vacuum exhaust step higher than the pressure-rising rate at the pressure-rising and HCl supply step, it is possible to make the execution time of the pressure-lowering and vacuum exhaust step shorter, for example, shorter than the execution time of the pressure-rising and HCl supply step. This makes it possible to shorten the processing time per one cycle and to improve the productivity of substrate processing.

(i) By using the HCl gas as the etching gas, it is possible to allow the etching process of the first Si film to go ahead even if the etching temperature is set at a temperature similar to the film-forming temperature (a temperature in the range of 450 to 550 degrees C.). This makes it possible to improve the productivity of substrate processing.

This is because, when a chlorine ($Cl_2$) gas is used as the etching gas, the etching temperature needs to be set at a temperature of, for example, about 350 degrees C., in order to etch the first Si film. In this case, it is necessary to prepare a temperature-lowering step, which waits until the internal temperature of the process chamber 201 is lowered by 100 degrees C. or higher and is stabilized, between the first-Si-film-forming step and the etching step. Furthermore, it is necessary to prepare a temperature-rising step, which waits until the internal temperature of the process chamber 201 rises by 100 degrees C. or higher and is stabilized, between the etching step and the second-Si-film-forming step.

On the other hand, in the present embodiments, since a series of steps from the first-Si-film-forming step to the second-Si-film-forming step can be performed at the same temperature, it is not necessary to prepare the temperature-lowering step or the temperature-rising step between these steps. This makes it possible to simplify the substrate processing procedure, to shorten the total time required for the substrate processing, and to improve the productivity of the substrate processing.

(j) By performing the etching step at a temperature at which the amorphous state of the first Si film is maintained at the first-Si-film-forming step when the first Si film of the amorphous state is formed, it is possible to avoid the crystallization of the first Si film. This makes it possible to maintain a high etching rate of the first Si film at the etching step, and to improve the productivity of the substrate processing. In addition, it is possible to avoid the local crystallization of a portion of the first Si film, and to suppress the formation of unevenness on the surface of the first Si film after the etching. As a result, it is possible to avoid the deterioration of the interface roughness between the first Si film and the second Si film or the deterioration of the surface roughness of a Si film as finally formed (a laminated film of the first Si film and the second Si film), i.e., the deterioration of smoothness of the surface of the film.

(k) By performing the first hydrogen purge step before the etching step, the surface of the first Si film formed on the wafer 200 can be terminated with hydrogen and the entire surface can be cleaned. This makes it possible to improve the uniformity of the etching process of the first Si film in the plane of the wafer 200.

(l) By performing the second hydrogen purge step during the execution of the etching step, it is possible to efficiently remove HCl, Cl, or the like remaining within the process chamber 201 from the interior of the process chamber 201. As a result, it is possible to avoid the lowering of the efficiency of the etching process of the first Si film when performing the pressure-rising and HCl supply step of the next cycle.

(m) The effects mentioned above can be similarly achieved in the case where the aforementioned precursor gas other than the MS gas is used, or in the case where an inert gas other than the $N_2$ gas is used.

(4) Modifications

The present embodiments may be modified as the modifications described below. Furthermore, these modifications may be arbitrarily combined. Unless otherwise specified, the processing procedures and processing conditions at each step of each of the modifications may be similar to the processing procedures and processing conditions at each step of the substrate processing sequence described above.

(Modification 1)

At the etching step, a pressure-maintaining step of supplying a HCl gas into the process chamber 201 while maintaining the internal pressure of the process chamber 201 at a constant pressure may be performed during a relatively short time. The pressure-maintaining step may be performed, for example, before the start of the pressure-rising and HCl supply step, may be performed during the execution of the pressure-rising and HCl supply step, or may be performed after the completion of the pressure-rising and HCl supply step and before the start of the pressure-lowering and vacuum exhaust step. When performing the pressure-maintaining step, the execution time may be set at a time from the start of the pressure-maintaining step to the time before the etching rate of the first Si film at the center of the wafer 200 is higher than the etching rate of the first Si film at the peripheral portion of the wafer 200. Even in this modification, the same effects as those of the aforementioned substrate-processing sequence illustrated in FIGS. 4 and 5 or the like may be achieved.

(Modification 2)

At the first-Si-film-forming step, a PH gas may be supplied to the wafer 200 together with (simultaneously with) the MS gas. In this case, the first Si film becomes a Si film doped with P as a dopant. The supply flow rate of the PH gas is appropriately determined according to the specifications or the like of a device formed on the wafer 200, but may be set at a flow rate which falls within a range of, for example, 0.1 to 500 sccm. Even in this modification, the same effects as those of the aforementioned substrate-processing sequence illustrated in FIGS. 4 and 5 or the like may be achieved. However, the technical problem (the deterioration of the uniformity of the etching process) due to the staying of the HCl gas described above remarkably occurs particularly when the first Si film is a non-doped Si film. Therefore, the technical significance of the etching process illustrated in the present embodiments is particularly significant when a non-doped Si film is formed on the wafer 200.

(Modification 3)

At the etching step, the aforementioned cycle may be performed only once. If the aspect ratio of the recess formed at the surface of the wafer 200 is not so large, it is also possible to process the vertical cross-sectional shape of the exposed hollow portion into a V-shape or the like merely by performing the aforementioned cycle once. In this case, it is possible to simplify the substrate processing procedure and to shorten the processing time.

(Modification 4)

The execution of one of the first hydrogen purge step and the second hydrogen purge step may be omitted. Furthermore, the executions of both of these steps may be each omitted. In these cases, it is possible to simplify the substrate processing procedure and to shorten the processing time. However, in order to further improve the uniformity of the etching process or to further improve the efficiency of the etching process, it is more desirable that these steps be performed without omission.

Other Embodiments

While one or more embodiments of the present disclosure have been specifically described above, the present disclosure is not limited to the aforementioned embodiments but may be differently modified without departing from the spirit of the present disclosure.

In the aforementioned embodiments, there has been described an example in which a series of steps from the first-Si-film-forming step to the second-Si-film-forming step are performed in the same process chamber 201 (in-situ). However, the present disclosure is not limited thereto, but for example, the first-Si-film-forming step and a group of steps after the etching step may be performed in different process chambers (ex-situ). Furthermore, for example, a series of steps leading to the etching step and the second-Si-film-forming step may be performed ex-situ. In addition, for example, the first- and second-Si-film-forming steps and the etching step may be performed ex-situ. Moreover, for example, each step may be performed ex-situ. However, when all the steps are performed in-situ, the wafer 200 is not exposed to the air on the way and the processing can be consistently performed with the wafer 200 kept in a clean atmosphere, enabling to perform a stable film-forming process.

Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities, and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

Even in the case of using these substrate processing apparatuses, the film formation may be performed by the processing procedures and processing conditions similar to those of the embodiments and modifications described above. Effects similar to those of the embodiments and modifications described above may be achieved.

The embodiments and modifications described above may be appropriately combined with one another. The processing procedures and processing conditions at this time may be similar to, for example, the processing procedures and processing conditions of the aforementioned embodiments.

EXAMPLES

Next, examples will be described.

In example 1, a Si film formed on a surface of a wafer was etched using the substrate processing apparatus illustrated in FIG. 1 and by the same processing procedure as that of the etching step in the aforementioned embodiments. When performing the etching step, the step of supplying the HCl gas into the process chamber while maintaining the internal pressure of the process chamber at a constant pressure was not performed. The number of cycles performed at the etching step was set to one. Other processing conditions were set to predetermined conditions which fall within the processing condition range described in the aforementioned embodiments.

In example 2, a Si film formed on a surface of a wafer was etched using the substrate processing apparatus illustrated in FIG. 1 and by the same processing procedure as that of the etching step in the aforementioned embodiments. When performing the etching step, the step of supplying the HCl gas into the process chamber while maintaining the internal pressure of the process chamber at a constant pressure was not performed. The number of cycles performed at the etching step was set to two. Other processing conditions were similar to those of example 1.

In a comparative example, a Si film formed on a surface of a wafer was etched using the substrate processing apparatus illustrating in FIG. 1 and by supplying the HCl gas into the process chamber while maintaining the internal pressure of the process chamber at a constant pressure when the internal pressure of the process chamber reaches a pressure which falls within a range of 28,000 to 32,000 Pa by increasing the internal pressure of the process chamber in which the wafer is accommodated. Other processing conditions were similar to those of example 1.

Figure 7A:
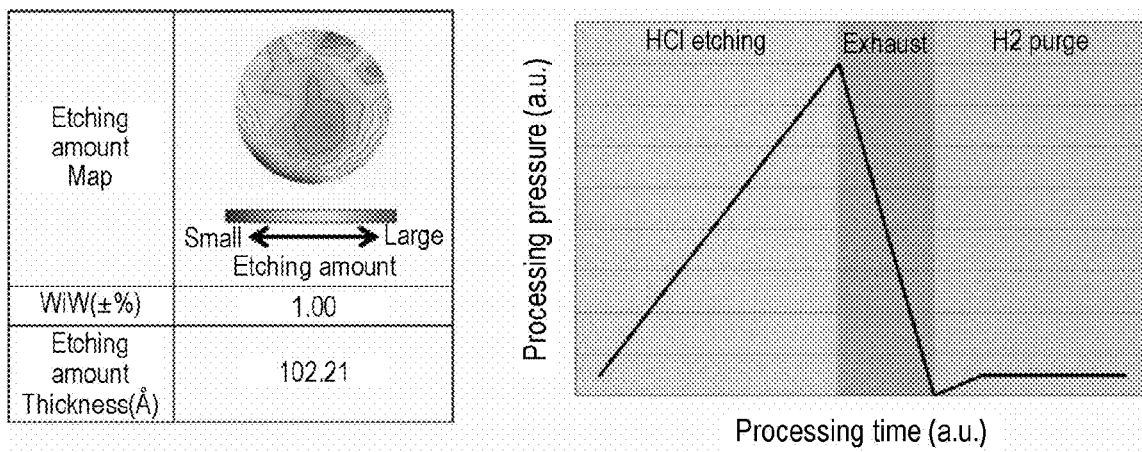
FIG. 7A is a diagram illustrating an evaluation result (example 1) of uniformity of an etching amount of a Si film in a plane of a wafer.

Then, for examples 1 and 2 and the comparative example, uniformity of an etching amount (WiW) in the plane of the wafer and an average etching amount (A) in the plane of the wafer were measured. FIGS. 7A to 7C are diagrams illustrating measurement results of examples 1 and 2 and the comparative example. WiW means that the smaller the value, the higher the uniformity of the etching amount in the plane of the wafer.

According to FIGS. 7A to 7C, it can be seen that WiWs of examples 1 and 2 are smaller than WiW of the comparative example. That is, it can be seen that the etching methods used in examples 1 and 2 (the method of the aforementioned embodiments) have better uniformity of the etching amount in the plane of the wafer than the etching method used in the comparative example. In addition, according to FIGS. 7A and 7B, it is understood that WiWs of examples 1 and 2 are substantially equal, and even when the number of cycles at the etching step is increased or decreased, there is no effect on the uniformity of the etching amount in the plane of the wafer. Moreover, since the average etching amount of example 2 is about twice the average etching amount of example 1, it is also understood that it is possible to accurately control the average etching amount by adjusting the number of cycles.

According to the present disclosure in some embodiments, it is possible to improve uniformity of an etching process in a plane of a substrate surface when a film formed on a surface of the substrate is etched.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a first Si film on a surface of the substrate;
   etching a portion of the first Si film by performing a cycle a predetermined number of times, the cycle including:
      supplying an etching gas, which is hydrogen chloride gas, into a process chamber while raising an internal pressure of the process chamber in a state in which the substrate having the first Si film formed on the surface of the substrate is accommodated in the process chamber; and
      lowering the internal pressure of the process chamber by exhausting an interior of the process chamber in a state in which supply of the etching gas into the process chamber is stopped; and
   after performing the act of etching the portion of the first Si film, forming a second Si film on the first Si film with the portion etched,
   wherein the act of forming the first Si film, the act of etching the portion of the first Si film, and the act of forming the second Si film are performed at the same temperature.

2. The method according to claim 1, wherein a pressure change amount per unit time in the act of lowering the internal pressure of the process chamber is set larger than a pressure change amount per unit time in the act of supplying the etching gas.

3. The method according to claim 1, wherein an execution time of the act of lowering the internal pressure of the process chamber is set shorter than an execution time of the act of supplying the etching gas.

4. The method according to claim 1, wherein in the act of etching the portion of the first Si film,
   the act of supplying the etching gas into the process chamber, while maintaining the internal pressure of the process chamber at a constant pressure, is not performed, or
   the act of supplying the etching gas into the process chamber, while maintaining the internal pressure of the process chamber at a constant pressure, is performed during an execution time which falls within a time before an etching rate of the first Si film at a center of the substrate is higher than an etching rate of the first Si film at a peripheral portion of the substrate.

5. The method according to claim 1, wherein in the act of etching the portion of the first Si film, the act of supplying the etching gas into the process chamber, while lowering the internal pressure of the process chamber, is not performed.

6. The method according to claim 1, wherein in the act of etching the portion of the first Si film, an etching rate of the first Si film is continuously increased while the etching gas is supplied into the process chamber.

7. The method according to claim 1, wherein the cycle further includes purging the interior of the process chamber with a hydrogen-containing gas.

8. The method according to claim 1, wherein in the act of etching the portion of the first Si film, the cycle is repeated multiple times.

9. The method according to claim 1, further comprising forming the first Si film so as to embed an inside of a recess formed at the surface of the substrate before performing the act of etching the portion of the first Si film.

10. The method according to claim 1, wherein the act of forming the first Si film, the act of etching the portion of the first Si film, and the act of forming the second Si film are performed in the same process chamber.

11. The method according to claim 1, wherein the act of forming the first Si film, the act of etching the portion of the first Si film, and the act of forming the second Si film are performed at a temperature equal to or lower than a crystallization temperature of the first Si film.

12. The method according to claim 10, wherein a maximum internal pressure of the process chamber in the act of etching the portion of the first Si film is set larger than a maximum internal pressure of the process chamber in each of the act of forming the first Si film and the act of forming the second Si film.

13. The method according to claim 1, wherein in the act of forming the first Si film and the act of forming the second Si film, a non-doped silicon film is formed as the first Si film.

14. The method according to claim 1, wherein in the act of forming the first Si film and the act of forming the second Si film, a silicon film doped with a dopant is formed as the first Si film.

15. A method of manufacturing a semiconductor device comprising the method of claim 1.

16. A substrate processing apparatus, comprising:
a process chamber in which a substrate is processed;
an etching gas supply system configured to supply an etching gas into the process chamber;
a pressure regulator configured to regulate an internal pressure of the process chamber;
an exhaust system configured to exhaust an interior of the process chamber; and
a controller configured to control the etching gas supply system, the pressure regulator, and the exhaust system so as to perform a process, the process comprising:
forming a first Si film on a surface of a substrate;
etching a portion of the first Si film by performing a cycle a predetermined number of times, the cycle including:
supplying the etching gas, which is hydrogen chloride gas, into the process chamber while raising the internal pressure of the process chamber in a state in which the substrate having the first Si film formed on the surface of the substrate is accommodated in the process chamber; and
lowering the internal pressure of the process chamber by exhausting the interior of the process chamber in a state in which supply of the etching gas into the process chamber is stopped; and
after performing the act of etching the portion of the first Si film, forming a second Si film on the first Si film with the portion etched,
wherein the act of forming the first Si film, the act of etching the portion of the first Si film, and the act of forming the second Si film are performed at the same temperature.

17. A non-transitory computer-readable recording medium storing a program that causes, by a computer, a substrate processing apparatus to perform a process in a process chamber of the substrate processing apparatus, the process comprising:
forming a first Si film on a surface of a substrate;
etching a portion of the first Si film by performing a cycle a predetermined number of times, the cycle including:
supplying an etching gas, which is hydrogen chloride gas, into the process chamber while raising an internal pressure of the process chamber in a state in which the substrate having the first Si film formed on the surface of the substrate is accommodated in the process chamber; and
lowering the internal pressure of the process chamber by exhausting an interior of the process chamber in a state in which supply of the etching gas into the process chamber is stopped; and
after performing the act of etching the portion of the first Si film, forming a second Si film on the first Si film with the portion etched,
wherein the act of forming the first Si film, the act of etching the portion of the first Si film, and the act of forming the second Si film are performed at the same temperature.

* * * * *